US 8,258,916 B2

(12) United States Patent
Tesson et al.

(10) Patent No.: US 8,258,916 B2
(45) Date of Patent: Sep. 4, 2012

(54) MEANDER RESISTOR

(75) Inventors: Olivier Tesson, Bretteville l'Orgueilleuse (FR); Frédéric Francois Barbier, Vimont (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/002,082

(22) PCT Filed: Jul. 2, 2009

(86) PCT No.: PCT/IB2009/052876
§ 371 (c)(1),
(2), (4) Date: Jun. 17, 2011

(87) PCT Pub. No.: WO2010/001352
PCT Pub. Date: Jan. 7, 2010

(65) Prior Publication Data
US 2011/0241820 A1    Oct. 6, 2011

(30) Foreign Application Priority Data
Jul. 2, 2008   (EP) ..................................... 08290648

(51) Int. Cl.
*H01C 1/012*   (2006.01)
(52) U.S. Cl. ......... 338/306; 338/315; 338/283; 338/333
(58) Field of Classification Search .................. 338/306, 338/315, 195, 139, 283, 333; 29/610.1
See application file for complete search history.

(56) References Cited

U.S. PATENT DOCUMENTS

| 4,808,009 | A | * | 2/1989 | Sittler et al. | ................... | 374/178 |
| 5,184,108 | A | * | 2/1993 | Bloom et al. | ................... | 338/195 |
| 5,324,960 | A | * | 6/1994 | Pfiester et al. | ................... | 257/67 |
| 5,635,893 | A | * | 6/1997 | Spraggins et al. | ............... | 338/48 |
| 6,836,207 | B2 | * | 12/2004 | Nothhelfer et al. | ........... | 338/138 |
| 6,960,744 | B2 | * | 11/2005 | Adkisson et al. | ............. | 219/494 |

FOREIGN PATENT DOCUMENTS

| DE | 101 08 662 A1 | 8/2001 |
| EP | 0 917 159 A | 5/1999 |
| GB | 2 251 731 A | 7/1992 |
| JP | 02197162 A | 8/1990 |
| JP | 03054854 A | 3/1991 |

OTHER PUBLICATIONS

Lai, T.T.; "Electrostatic Discharge Sensitivity of Thin Film Hybrid Passive Components"; IEEE Transactions on Components, Hybrids, and Mfg. Tech. USA, Vol. 12, No. 4; pp. 627-638 (Dec. 1989). Lee, Jaesik, et al; "Design-For-ESD-Reliability for High-Frequency I/O Interface Circuits in Deep-Submicron CMOS Technology"; ISCAS 2001; IEEE, Piscataway, NJ, USA, Vol. 4; pp. 746-749; (2001).
Sampson, M. J., et al; "Electrostatic Discharge Effects on Thin Film Resistors"; 19th Capacitor and Resistor Techn. Symp., Carts '99 Components Technol. Inst., Huntsville, AL, USA; pp. 208-217 (1999).
International Search Report and Written Opinion for Application PCT/IB2009/052876 (Sep. 30, 2009).

* cited by examiner

*Primary Examiner* — Kyung Lee

(57) ABSTRACT

The present invention relates in general to the field of integrated circuits, and more specifically to a meander resistor. Basically, a meander resistor can be considered as a bar resistor with the exception of the corner squares (right-angle bends). The Electrostatic Discharge (ESD) sensitivities of on-chip resistors can be a problem for both electronic manufactures and electronic component users. As others components, passive devices are known to be susceptible to ESD events. The context of this invention is to improve the reliability of the resistors during an ESD event. An ESD stress means that high current and high voltage levels are applied to the device. The device has to be able to dissipate this energy without failure.

10 Claims, 5 Drawing Sheets

MEANDER RESISTOR

FIELD OF THE INVENTION

The present invention relates in general to the field of integrated circuits, and more specifically to a meander resistor. Basically, a meander resistor can be considered as a bar resistor with the exception of the corner squares (right-angle bends).

BACKGROUND OF THE INVENTION

The Electrostatic Discharge (ESD) sensitivities of on-chip resistors can be a problem for both electronic manufactures and electronic component users. As others components, passive devices are known to be susceptible to ESD events. The context of this invention is to improve the reliability of the resistors during an ESD event. An ESD stress caused by such an event means that high current and high voltage levels are applied to the device. The device has to be able to dissipate this energy without failure. Several articles have already put in some enhancements for meander resistor designs (see e.g. T. T. Lai, Electrostatic Discharge Sensitivity of Thin Film Hybrid Passive Components, 0569-550389/0229 IEEE, pp 229-239). These enhancements are based on a study on current densities within inner corners of a meander resistor (i.e. rounded corners provide a more uniform current density in such an area). But, it appears that is not sufficient and the present invention will describe a new resistor layout that creates a breakthrough in term of ESD sensitivity.

JP02197162 A discloses a resistor, in order to enable a diffusion resistor to vary in resistance by stages in accordance with the increase of an applied voltage by a method wherein a diffusion layer is formed in such a constitution that two different spaces are combined to be provided in the diffusion layer. A P-type diffusion layer is formed in meanders on an N-type Si substrate, which is covered with a $SiO_2$, and electrodes are provided, which are covered with a $SiO_2$. When a p-n junction is reversely biased, a depletion layer is made to expand toward the substrate side at a low voltage. When an Al film is provided onto the P+ layer to serve as an optical shielding layer and connected to the electrode of a low voltage, a depletion can be made to spread at a low voltage. When a reverse bias exceeds a specified value, depletion layers are linked together in the substrate and a current flows direct without meandering, so that the diffusion layer decreases in resistance. If the depletion layers are not linked together, the layer is high in resistance. In the diffusion layer, when the combination of two different spaces in the layer is changed, the layer of optional resistance change characteristic can be realized.

Thus a meander resistor is disclosed being improved against high voltage stress applied on it. It seems diffusion zones are used to sink the current not through the meander path, but directly between two active diffusions nearby. As such a parasitic device of the resistor (in this case a PNP bipolar transistor) is triggered. Indeed this might be a way to increase its robustness with respect to ESD or EOS (electrical over stress). However, it only refers to a so-called diffusion resistor, which is built inside a substrate. Furthermore it does not relate to a specific layout of the resistor. In addition, it does not relate to meander resistors made on top of several substrates, such as silicon, laminate and LTCC. The validation part showed the case of polysilicon resistors, but it is known that all metallic resistors will exhibit the same improvement.

JP03054854 discloses a semiconductor device in order to prevent current concentration of a bending part while improving breakdown strength of a resistance film at the time of impressing electrostatic energy by making a bending part of the resistance film constituting an input protective circuit of a MOS element higher in impurity concentration than the other part and making the resistance low. An impurity is additionally doped to a bending part of a polycrystalline Si resistance film for an input protective circuit of an element on a semiconductor substrate having laminated MOS elements. Accordingly, the bending part gets higher impurity concentration than the other part for having low resistance. Thereby, current concentration inside the bending part at the time of impressing electrostatic energy is prevented, and as a result puncture voltage of polycrystalline Si resistance consisting of a bent resistance film is improved so that electrostatic breakdown strength of the input protective circuit of a laminated MOS element is improved.

This patent focuses on the doping profile of the bended resistor to improve its ESD sensitivity. This is different from a layout design improvement, without virtually any modification of the process step.

Thus, the above resistors, still suffer from reliability problems which need to be improved in terms of ESD stresses. Actually, a goal of the present invention is to reduce the risk of failure of a non diffused (back-end) resistor due to an ESD/EOS stress by a simple modification, and without virtually any modification of the process steps involved in manufacturing such a resistor.

Thus, in view of the above problems, there still is a need for improved meander resistors.

The present invention aims to overcome one or more of the above-mentioned problems and/or disadvantages, without jeopardizing other characteristics, by providing an improved meander resistor.

SUMMARY OF THE INVENTION

The present invention provides a novel meander resistor, wherein in a meander resistor layout consists in moving the resistor heads far away from a corner of a body surrounding the resistor.

An important advantage thereof is that the chance on ESD damage is significantly reduced. Further, the present meander resistor can be incorporated in most or all of existing process flow, without introducing extra process steps. Also very reliable resistors are provided, e.g. in terms of ESD stresses. Further, the present resistors can withstand much higher voltages.

DETAILED DESCRIPTION OF THE INVENTION

In a first aspect the present invention relates to a semiconductor device for preventing ESD damage comprising a substrate, a 3-D shaped body (150) comprising a non-conducting material on said substrate, which body further comprises a meander resistor (140) which resistor comprises a conducting material, the resistor having resistor heads (130), wherein the resistor heads (130) are relatively far away from any corner of the body.

The present invention does not comprise a PNP bipolar transistor which inherently forms part of the meander resistor or is at such close range to the meander resistor that is in terms of ESD in cooperation therewith, which transistor as a side effect may be triggered as parasitic device, e.g. in cases of ESD, as is the case in the prior art. On the contrary, in case of an ESD event the current caused by such an event will still run through the meander resistor that is if the resistor is not already damaged to such an extent by the ESD event that a current can no longer run. By the specific layout of the present meander resistor the chance that the resistor gets damaged by an ESD event occurring has become smaller compared to standard layouts.

The substrate whereon the meander resistor is formed can be a material chosen from non conducting materials, such as dielectrics, polymers, silicon, ceramics, laminates and glasses, sapphire, and combinations thereof. The substrate may be in the form of a laminate. The substrate thickness is in the order of 400-800 µm, such as 675 µm, when formed, and in the order of 100-500 µm, such as 250 µm, in a final package. Such a substrate can e.g. be a silicon wafer.

The substrate typically comprises other elements, as transistors, which form a semiconductor device, such as an IC. The device further comprises the present meander resistor. As mentioned above, these other elements do not form part of the present resistor, either inherently or expressly.

Typically the 3-D shaped body is a rectangular shaped body with a certain height, e.g. a box like shape. As such, the body comprises 8 corners. It is made of a non-conducting material in order to electrically isolate the meander resistor from its environment, as well as to protect the resistor from environmental influences, such as heat, moisture etc. The body surrounding the meander resistor is made from a material chosen from the group consisting of dielectrics, polymers, ceramics, laminates and glasses, and combinations thereof, but preferably is a dielectric, such as oxide, nitride, or oxynitride, preferably silicon oxide or silicon nitride. Preferably a material is chosen that is already used in a process wherein the present semiconductor device is manufactured. The thickness of the body is comparable to that of the conducting material used to form the meander resistor, though typically it is somewhat larger. Contrary to many prior art resistors the present resistor is formed on the substrate, instead of in the substrate. As such, also the body is formed on the substrate.

In general, a laminate protects the meander from environmental and other influences. Preferably the laminate is chosen from the group consisting of laminate substrates such as PCB, LTCC, organic laminates and equivalents, or combinations thereof. The laminate may be present in the form of a multi-layer laminate, e.g. forming a sandwich, but also in the form of a single layer, if applicable.

The number of layers that can be used in such a sandwich, is strongly related to thickness of each layer and of to the size of the envisaged package. Usually a maximum number of 10 to 50 layers can be realized and a minimum of 2 to 4 layers is admitted.

The term "laminate" is a very generic one. In fact, most of the substrates (except e.g. silicon) have a lamination step during their manufacturing process. In this part, we will briefly describe organic laminate substrates suitable for RF and millimeter wave applications.

A laminate substrate is generally made of three or four metallic levels with thick (25 to 200 µm) dielectric organic layers between them. There are two major methods used to deposit the metallization layer at the surface of the dielectric. The former consists on growing electroplated copper and the latter consists in laminating the layer with metal. In case of the second option costs are bigger, but it leads to a high quality surface state on top of the metal (in case of RF it is also an important criteria). In case of a meander resistor one metal layer could be sufficient.

The meander resistor it typically placed parallel to the substrate surface; however, a configuration perpendicular to the surface is also possible. Process conditions may influence the choice of the positioning.

The present meander resistor is preferably made of a conductor, such as a material chosen from the group consisting of polysilicon, metals, such as aluminum, copper, tungsten, titanium, and combinations thereof, doped (poly) silicon, and combinations thereof. Preferably it is made from polysilicon. The material is typically deposited on the substrate and thereafter patterned. In order to improve conductivity the polysilicon may be N- or P-type doped.

The thickness of the tracks forming the meander resistor is from 0.1 µm to 10 µm, preferably from 0.3 µm to 5 µm, more preferably from 0.8 µm to 3 µm, such as 1 µm. The width of the tracks can be from 1 up to 100 µm, preferably from 2 µm to 50 µm, more preferably from 5 µm to 30 µm, such as 10 µm or 20 µm. A thicker track, as well as a wider track is preferred, in view of a better conductivity obtained. The space in between tracks is preferably much smaller than the width thereof, e.g. in the order of preferably from 1 µm to 20 µm, more preferably from 2 µm to 10 µm, such as 3 or 5 µm. The distance is limited by capacitance of the non-conducting layer, e.g. a dielectric layer, in between tracks.

The number of parallel tracks in the meander resistor is from 2-1000, such as from 5-100, such as 10, depending on the required resistance.

In a preferred embodiment the metal layers comprise an element chosen from the group of copper, aluminum, tungsten, or combinations thereof. Also the vias may be formed of such a metal, or combinations thereof. Alternatively, any conducting material may be chosen. It is important that such a material is compatible with the manufacturing process used, and that such a material has a good electrical conductivity, preferably also having a good thermal conductivity. Therefore copper is preferred. The material of the various metal layers and that of the vias need not be the same, e.g. the vias may be formed of tungsten, whereas the metal layers may be formed of aluminum, or copper, or a first metal layer may be formed of aluminum and a second metal layer may be formed of copper.

The resistor comprises two contact points, also referred to as resistor heads. The tracks of the meander resistor form one conducting path from a first resistor head to a second resistor head. The resistor heads are contacted to other parts of the device. Typically the resistor heads are outside a plane wherein the meander is placed, such as above the plane. Specifically the resistor heads are vulnerable in terms of ESD.

The dielectric layer is generally made of a sandwich of several layers such as (glass fibres, quartz, quartz fibres, carbon with some PTFE (well known as Teflon®).

By combining several materials, it is possible to obtain "a global sandwich" with different relative permittivity. The relative permittivity of PTFE is equal to 2.07, while that of glass fibre is equal to 6.0. It is also possible to incorporate ceramic inside the PTFE to increase the relative permittivity.

The following table summarizes the most common materials used with their relative physical properties.

TABLE 1

Example of physical properties for various laminate substrate (courtesy of Claudine Vasseur)

| Reference | Laminate composition | Thermal conductivity W/m · K | Electrical resistivity (Volume) Ω · cm | Coefficient of thermal expansion (CTE) ppm/K | | | Tan δ |
|---|---|---|---|---|---|---|---|
| | | | | X | Y | Z | |
| CuFlon | PTFE | 0.25 | 10$^{12}$ | 227 | 227 | 227 | 0.00045 |
| NX9240 | Glass fiber/PTFE | 0.251 | 10$^8$ | 12 | 18 | 170 | 0.0016 |
| NorClad | Thermoplastic (PPO) | 0.235 | 10$^{10}$ | 53 | 53 | 53 | 0.0011 |
| Rexolite1422 | Polystyrene | 0.235 | 10$^{10}$ | 53 | 53 | 53 | 0.00066 |
| CLTE | Ceramic/PTFE | 0.5 | 1,4.10$^6$ | 10 | 12 | 40 | 0.0025 |
| RO3003 | Ceramic/PTFE | 0.5 | 10$^6$ | 17 | 17 | 24 | 0.0013 |
| RF35P | Glass/ceramic/PTFE | 0.226 | 5.10$^8$ | 15 | 15 | 110 | 0.0025 |
| RF35 | Glass/ceramic/PTFE | 0.2 | 1,3.10$^9$ | 19 | 24 | 64 | 0.0018 |
| Orcer RF 60 | ceramic/PTFE | 0.61 | 10$^6$ | 17 | 17 | 24 | 0.002 |

Design rules for laminates are in the same order of magnitude as in LTCC substrate. Typically, each dielectric layer has thickness of about 35 μm to 100 μm. Thickness of metal layers is generally comprised between 20 μm and 30 μm. It is generally thicker than in LTCC; it leads to lower resistance and also lower inductance. Concerning the line width a value of 65 μm is generally admitted with an average space of 70 μm, however smaller values as 30 μm are also possible. In terms of a global sandwich, a maximum of four dielectric layers is generally used. Low cost laminate solutions utilize mechanical drilled vias that are 200 μm in diameter. The via hole is partially filled with metal. However, the hole is too large to be completely filled with metal.

The term "relatively far" relates to one or more of the dimensions of the body. Thus it encompasses embodiments having resistor heads placed more than 0.1, preferably more than 0.2 away from a corner of the body.

In a preferred embodiment the present invention relates to a semiconductor device, wherein the heads are located away from a corner at approximately 0.4-0.6 times the length of a first dimension, wherein the first dimension preferably is the largest dimension.

Advantages of this embodiment are e.g. that the risk of ESD damage is further reduced, albeit at the cost of increasing the area needed to place the meander resistor.

In yet a further preferred embodiment the present invention relates to a semiconductor device, wherein the heads are approximately located away from a corner at more than 0.1*the width of a second dimension, preferably approximately located away from a corner at more than 0.2*the width, wherein the second dimension preferably is the one but largest dimension.

The farther away the heads are from the corner of the body, the better results are obtained, e.g. in terms of ESD protection.

Advantages of this embodiment are e.g. that the risk of ESD damage is further reduced, albeit at the cost of increasing the area needed to place the meander resistor.

Preferably the present meander resistor is a combination of the two here directly above-mentioned preferred embodiments, wherein further preferred elements are incorporated.

In yet a further preferred embodiment the present invention relates to a semiconductor device, wherein the meander resistor is made on top of one or more substrates, wherein the substrates are chosen from the group consisting of silicon, laminate, LTCC, and combinations thereof.

In yet a further preferred embodiment the present invention relates to a semiconductor device, wherein the resistor is made of a material chosen from the group consisting of polysilicon, metal, doped (poly) silicon, and combinations thereof, preferably from polysilicon.

Polysilicon is a material that is easily integrated into existing processes.

In a second aspect the present invention relates to a device, comprising a semiconductor device according to the invention. These devices are as a consequence much more robust against ESD damage. Further, the above-mentioned advantages are also applicable to these devices.

The present invention is further elucidated by the following Figures and examples, which are not intended to limit the scope of the invention. The person skilled in the art will understand that various embodiments may be combined.

DETAILED DESCRIPTION OF THE DRAWINGS

Figures 1A, 1B:
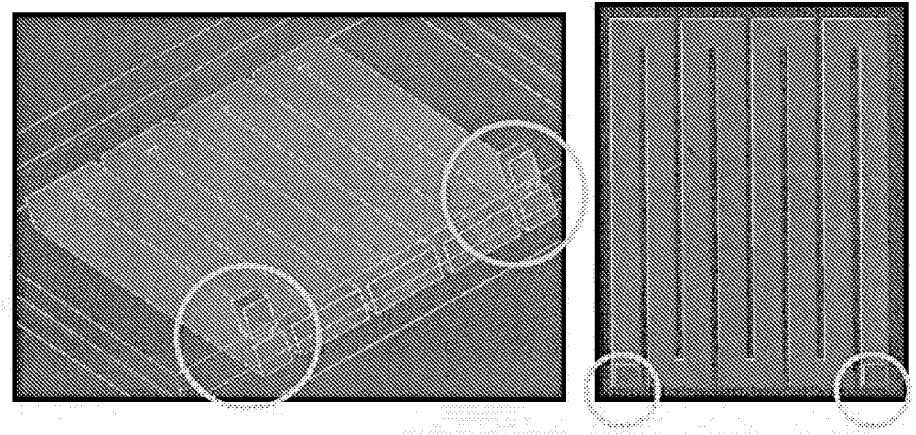
FIG. 1A and FIG. 1B show a prior art meander resistor.

In FIG. 1, a standard meander resistor is presented: FIG. 1(a) shows a 3D-view of a standard meander resistor and FIG. 1(b) its top view. A circle surrounds head resistors.

Figure 2:
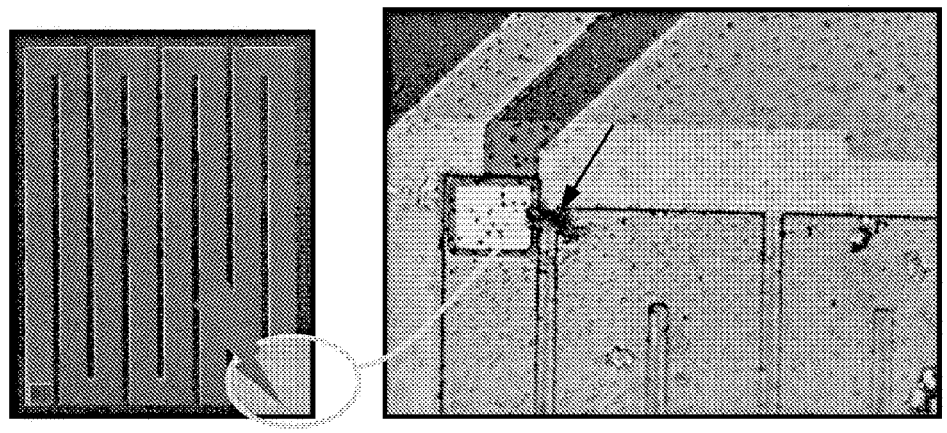
FIG. 2 shows ESD damage in a prior art meander resistor.

In FIG. 2, one can clearly see where failure occurs: an electrical overstress during ESD event can lead to damage of the resistors between the stressed terminal (i.e. head) and the closest body corner. The present invention is based on a layout recommendation to improve the ESD sensitivity of meander resistor.

Figure 3:
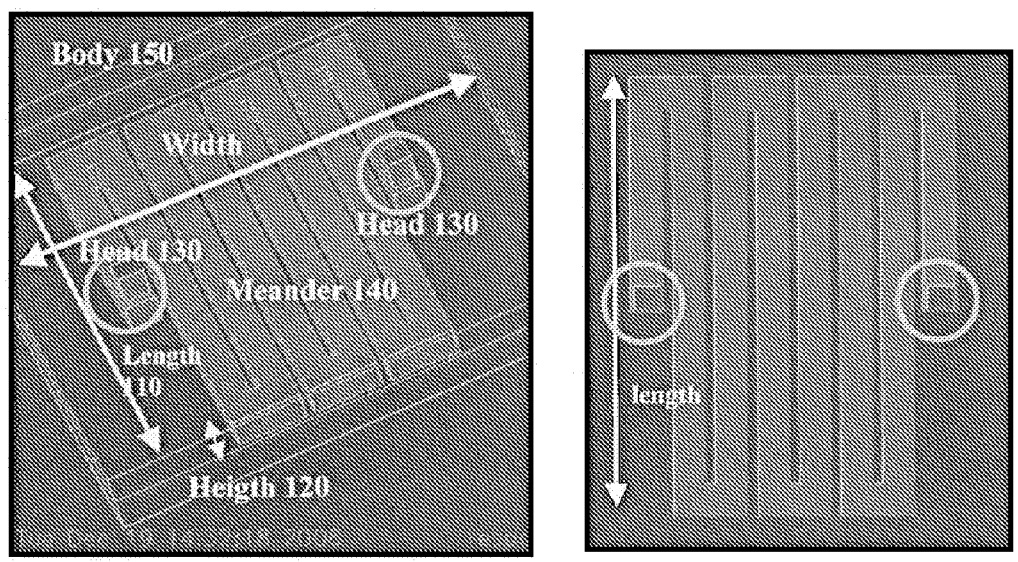
FIG. 3 shows the present layout of the resistor.

Here is an illustration (FIG. 3) of the improved layout. The head of the resistor has moved from the bottom to half of the resistor length. This layout option strongly reduces the risk of electrical overstress between the body corner of the first bend and the stressed terminal of the resistor. During an ESD event, a too high electrical field can be applied between the stressed contact and the closest peaked corner of the meander resistor.

Two cases can be considered

1) The material used to isolate these two nodes is very prone to be damaged when its breakdown voltage is locally reached due to the high electrical field. By moving the contact to the middle of the bended resistor, this modification decreases the risk of failure of isolation material filling the space between segments of the resistors.

2) If the resistor is not encapsulated and/or an isolation material does not fill the space between segments, arcing would occur between the corner and the resistor terminal. This arcing effect would result in damages on the terminal itself as well as the closest resistor corner due to electrical field.

Validation Experiments:

Transmission Line Pulse measurements (an ESD engineering test used to characterize some devices under ESD pulse) have been done on an on-chip polysilicon resistor with and without the present layout improvement of the head resistor connections.

Transmission Line Pulse (TLP) testing is used to study the behavior of devices under ESD circumstances. During TLP testing a charged transmission line is discharged to the Device Under Test (DUT). Voltage and current are recorded as a function of time. Typically, the transmission line causes a pulse with duration of 100 ns, with a rise time of 10 ns. The current and voltage readings averaged over a time window at the end of the pulse (the window in the Figure) are used as 1 point of the pulsed I-V characteristic. The user can often adjust this integration window. This whole procedure is repeated with higher charges on the transmission line to construct a complete TLP characteristic (pulsed I-V characteristic). After each pulse a DC measurement is done to verify whether the device is damaged or not. This is typically a leakage current measurement at a specified voltage or a DC curve trace. The leakage current is plotted on the secondary x-axis as a function of the TLP current.

TLP measurements stop if the system reaches the maximum voltage/current of the system, if a pre-defined failure criterion is met, or if the operator intervenes. Between 2 pulses, DC leakage measurements have been performed to monitor the resistance value.

Figure 4:
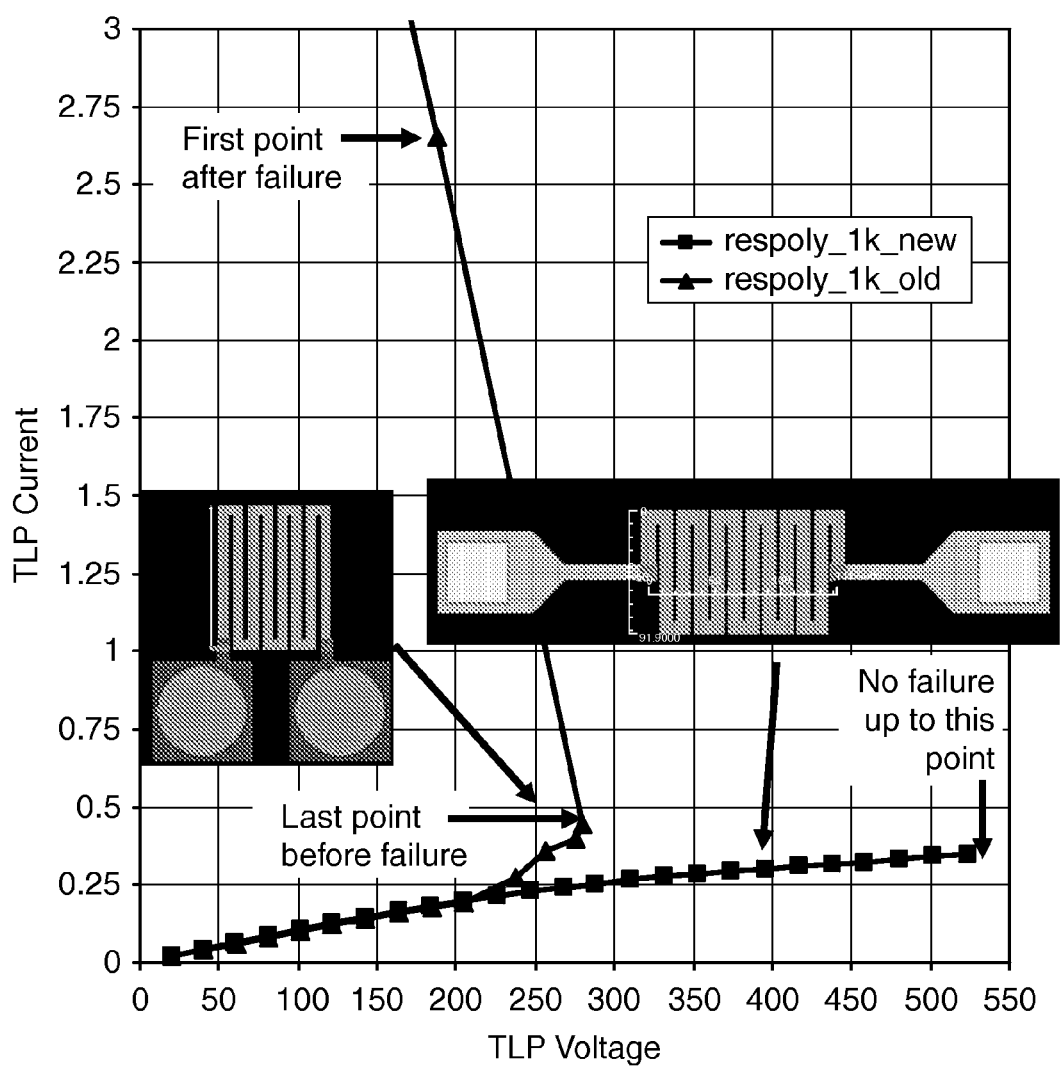
FIG. 4 shows transmission line pulse curves.
Figure 5A:
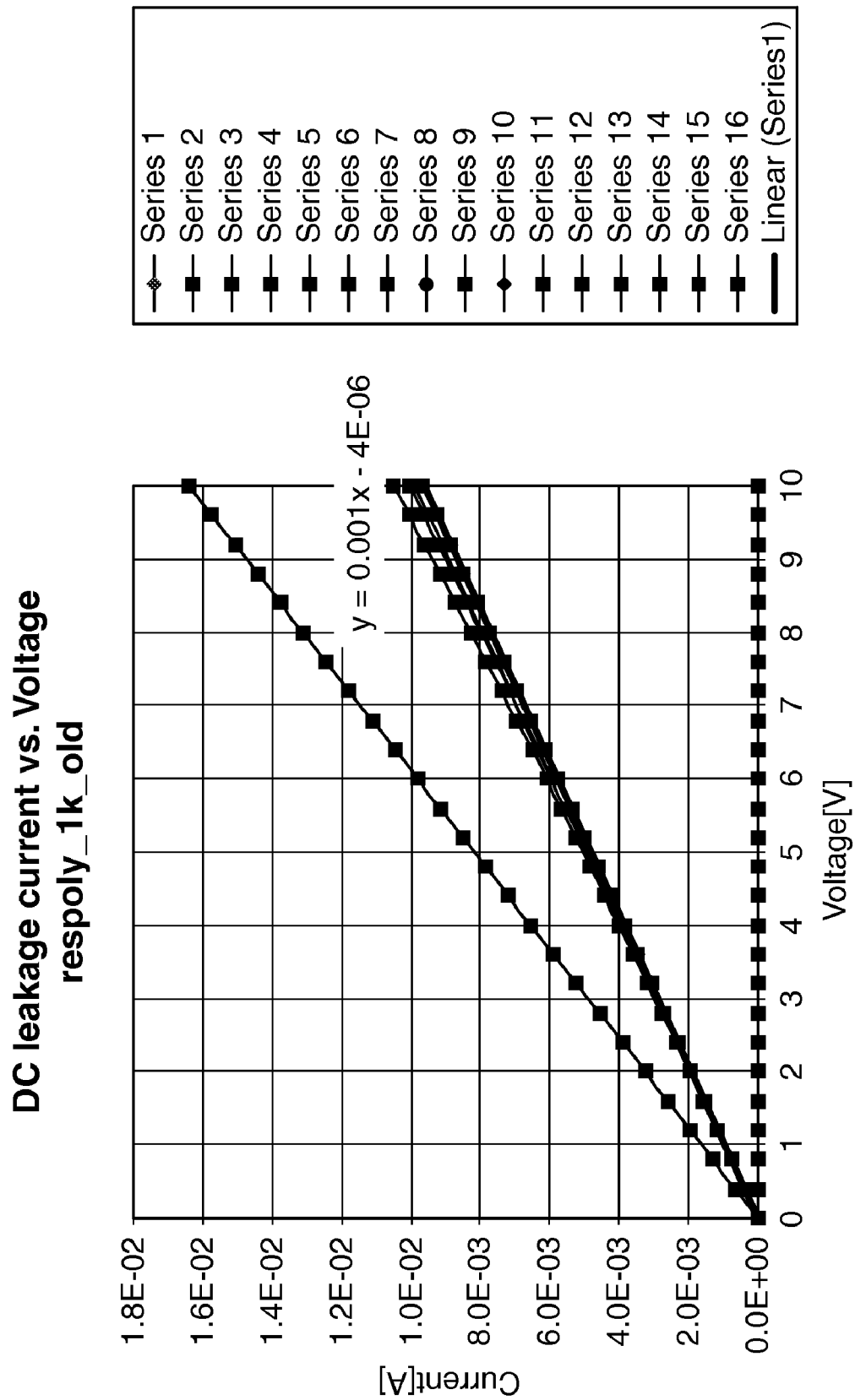
FIG. 5A shows DC leakage measurement curves of the prior.
Figure 5B:
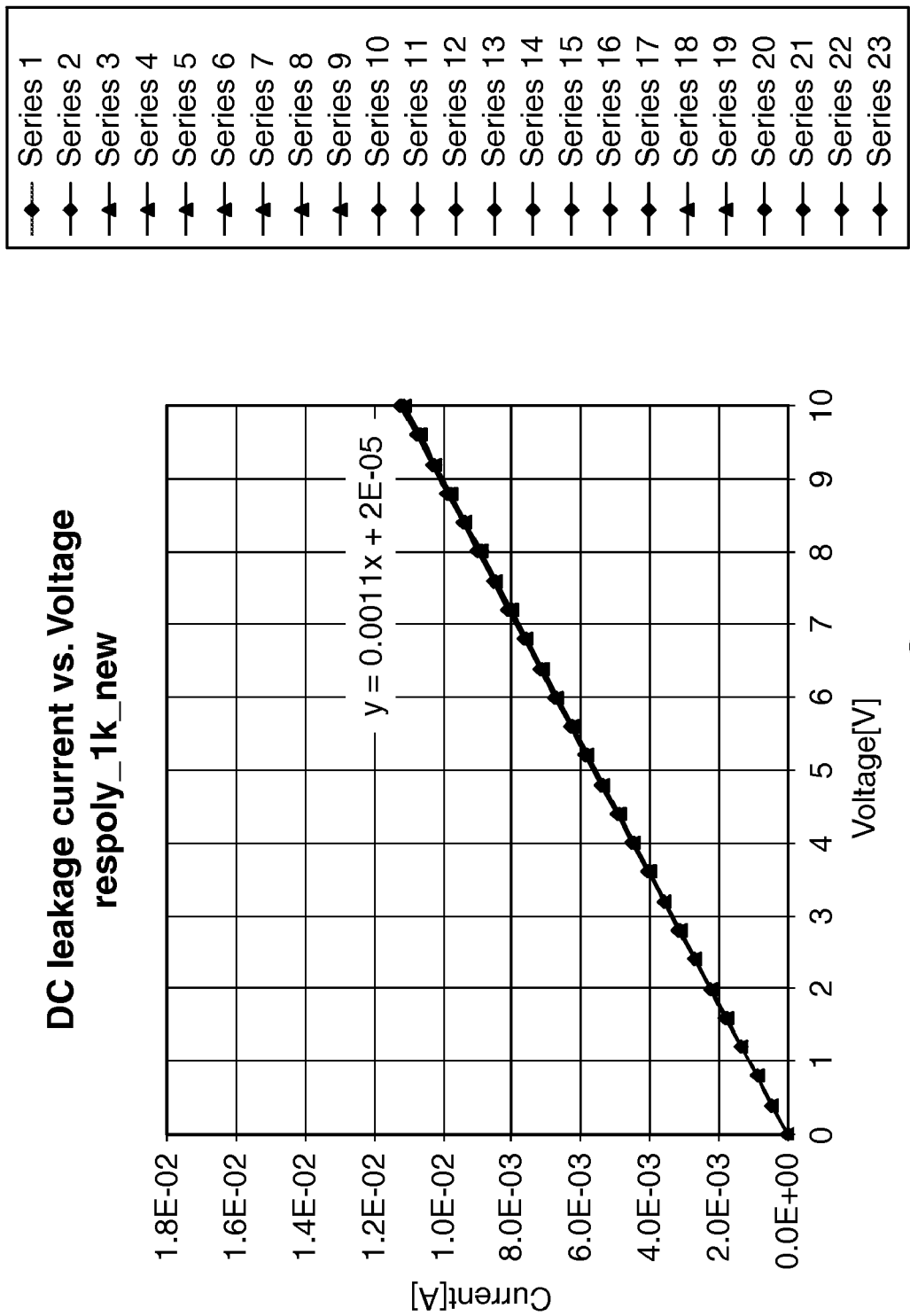
FIG. 5B shows the DC leakage measurement curves of the current invention.

The following Figures show the TLP curves (FIG. 4) for both resistor designs and their DC leakage measurements (FIG. 5 top and bottom). With the TLP test bench, a DC leakage current versus DC voltage between each incremental pulse is performed. So FIG. 4 represents all the TLP (pulses) I-V points, to get at the end the TLP curves (15 points for the old device and 25 points for the new version)) All these points are caught from pulses that last 100 ns. It is not DC data. Between each pulse, a simple DC IV measurement is performed. The results are shown in FIG. 5. It is chosen to perform a voltage sweep between 0V and 10V to check the DC behavior of the resistors. In FIG. 5 it is DC data. On the old resistor version, the DC IV curve changes at series 15 (=15th point of the TLP curve). It can observed that the prior art resistor fails at around 275V TLP. The present version does not shown any modification of the DC curve up to the series 25. There is neither any modification on the TLP curve. The resistor can sustain 525V TLP. Actually during the TLP test there are 2 types of measurements: pulse measurements and between each pulse, DC measurements. For the improved version (respoly_1k_new) there is no change in resistance value up to the maximum current pulse provided by the TLP test bench. On the standard version (respoly_1k_old), there is a change in the resistance value at series 15 that is well below the ESD performance reached by the new version.

The present meander resistor is also valid for meander resistors made on top of several substrates: silicon, laminate and LTCC. It is noted that the validation part shows a case of polysilicon resistors, and as such is limited thereto. However, all conducting resistors, such as metallic resistors, exhibit the same behavior.

The invention claimed is:

1. Semiconductor device for preventing ESD damage comprising:
   a substrate,
   a 3-D shaped body comprising a non-conducting material on said substrate, which body further comprises a meander resistor having a generally rectangular outer shape which resistor comprises a conducting material, the resistor having resistor heads,
      wherein the 3-D shaped body electrically isolates the meander resistor from its environment; and
      wherein the resistor heads are each located along a side edge of the rectangle away from a corner of the rectangle at least 0.1 times the length of the side edge from the corner.

2. Semiconductor device according to claim 1, wherein the heads are each located along a side edge of the rectangle at least 0.2 times the length of the side edge from the corner.

3. Semiconductor device according to claim 1, wherein the meander resistor is made on top of one or more substrates, wherein the substrates are chosen from the group consisting of silicon, laminate, LTCC, or combinations thereof.

4. Semiconductor device according to claim 1, wherein the resistor is made of a material chosen from the group consisting of polysilicon, metal, doped (poly) silicon, or combinations, thereof.

5. Device, such as a circuit, such as a filtering network, a matching network, and/or a silicon based system in package (sbSIP), such as a RF transceiver for a mobile phone, comprising a semiconductor device according to claim 1.

6. The semiconductor device according to claim 4, wherein the resistor is made of polysilicon.

7. The semiconductor device according to claim 1, wherein the heads are each located along a side edge of the rectangle at approximately 0.4-0.6 times the length of the side edge from the corner.

8. The semiconductor device according to claim 1, wherein the heads are each located along one of the longest side edges of the rectangle.

9. The semiconductor device according to claim 2, wherein the heads are each located along one of the longest side edges of the rectangle.

10. The semiconductor device according to claim 7, wherein the heads are each located along one of the longest side edges of the rectangle.

* * * * *